US005980275A

United States Patent [19]
Beaman et al.

[11] Patent Number: 5,980,275
[45] Date of Patent: Nov. 9, 1999

[54] ELECTRONIC CIRCUIT BOARD INTERFACE MOUNTING BRACKET

[75] Inventors: Daniel Paul Beaman; Yat Hung Ng; Craig Henry Shempert, all of Austin, Tex.

[73] Assignee: International Business Machines, Corp., Armonk, N.Y.

[21] Appl. No.: 08/517,044

[22] Filed: Aug. 21, 1995

[51] Int. Cl.[6] ...................................................... H05K 7/14
[52] U.S. Cl. ............................................. 439/92; 361/799
[58] Field of Search ................................. 439/92, 95, 97, 439/939; 361/799, 800

[56] References Cited

U.S. PATENT DOCUMENTS 5,467,254  11/1995  Brusati et al. ........................... 361/799

OTHER PUBLICATIONS

IEEE Draft Standard for a Common Mezzanine Card Family: CMC, P1386/Draft 2.0., Apr. 4, 1995.

*Primary Examiner*—Gary F. Paumen
*Attorney, Agent, or Firm*—Laurence R. Letson; Mark E. McBurney

[57] ABSTRACT

A bracket for mounting a printed circuit card into the frame of a personal computer or work station is provided with supporting and locating arms which are attached to the printed circuit card and a plurality of grounding contacts disposed along the walls of a channel-shaped bracket to engage a mating surface within the computer frame. The grounding contacts are supplemented both with a spring finger which is deformed upon assembly of the bracket with the computer frame and also with projecting legs which define a gap through which a fastener may be inserted and tightened in order to rigidly attach the bracket to the computer frame. The bracket is provided with an opening or aperture to permit access therethrough for interface plugs necessary to interface the printed circuit card electrical outputs with other devices which need to be connected to the computer such as telephone lines, printer cables, and networking connections.

13 Claims, 3 Drawing Sheets

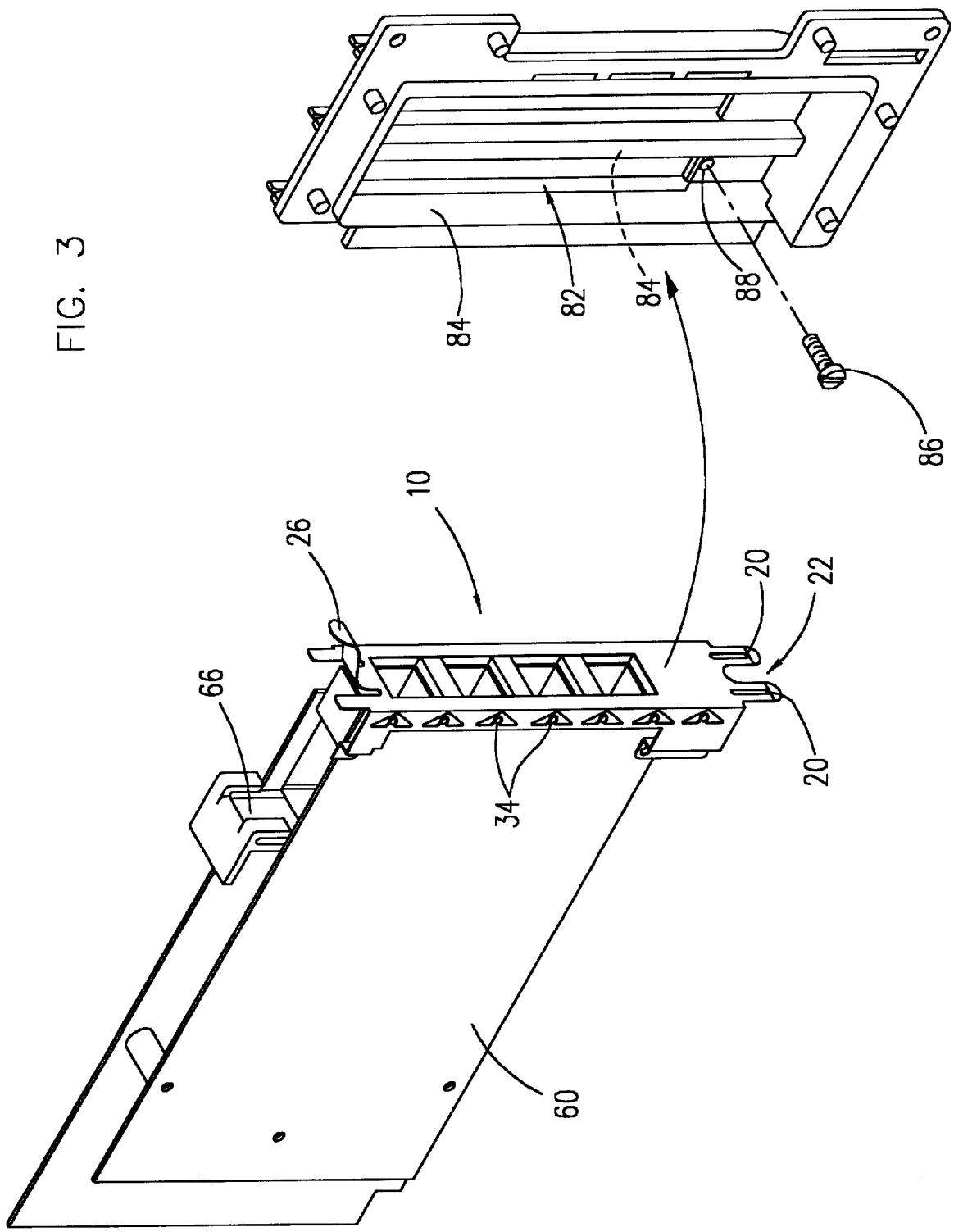

ELECTRONIC CIRCUIT BOARD INTERFACE MOUNTING BRACKET

FIELD OF THE INVENTION

This invention relates to the mounting of printed circuit board in personal computers and computer work stations and more particularly to the mounting technique for a common mezzanine card at an opening in the computer frame.

BACKGROUND OF THE INVENTION

Many computer manufacturers are or will be using a printed circuit card or board which is attached to a larger printed circuit card or board and which in turn is connected to the electronics, particularly a buss or a Micro Channel, of the computer. The printed circuit card which has been added or piggy-backed is called a common mezzanine card. The common mezzanine card allows one or more functions such as a printer control, fax or network operation to be provided by the combined printed circuit card assembly without changing the electronic design of the host card to which the mezzanine card is attached. The mezzanine circuit card attached both physically and electrically to the host card permits, among other things, the external interfacing of the function provided. For example, if a function is that of printer control, the interface must accept a printer cable connector; while if the function is facsimile, of necessity, the interface must accept a standard telephone jack connector.

The Institute of Electrical and Electronic Engineers (IEEE) is an organization which establishes and administers some standards in the computer industry. A Draft Standard for a Common Mezzanine Card Family: CMC, P1386/Draft 2.0, Apr. 4, 1995, has been prepared by IEEE which will standardize the dimensional parameters and shape of a common mezzanine card bezel. However, the IEEE proposed standard is ambiguous as to the technique for mounting or attaching the mezzanine card bezel to the interface port or slot, also known as the expansion slot, within the frame of the computer or work station.

Several requirements must be satisfied in the attachment or mounting of the mezzanine card to the computer frame or work station frame. One such requirement is that the interface must be exposed so that the appropriate cables and connectors may be attached to the common mezzanine card at the interface.

A second requirement for the attachment or mounting of the mezzanine card is that electromagnetic radiation (EMR) generated within the computer frame must be suppressed, contained and prevented from escaping from the computer or work station unit and causing electromagnetic interference (EMI) either to the host device or to other electronic devices in the immediate area.

A third requirement for the attachment or mounting of the mezzanine card is that the interface structure of the mezzanine card be rigid and fixed relative to both the mezzanine card and the computer/work station frame to permit plugging and unplugging of cables without disturbing the position or the connection of the mezzanine card relative to other electronic circuits within the computer or work station.

Expansion cards previously have been provided with mounting brackets that are specifically designed to include the appropriate interface connector and thus not be universal. Additionally, present expansion cards require mounting brackets that are unique to a particular expansion card. Further, the expansion card brackets have relied only on a single screw to insure a grounding contact with the grounding circuit of the computer frame. Both of these design aspects provide less than desirable approaches in high performance computers because the bracket must be designed separately for each input/output interface requirement and the electromagnetic interference shielding is less than optimum in effectiveness for high speed computer operations.

OBJECTS OF THE INVENTION

It is an object of the invention to provide improved electromagnetic interference shielding for the computer/work station electronic circuitry.

It is another object of the invention to provide a universal mounting bracket which can accommodate a variety of input/output interface configurations.

It is a further object of the invention to support a mezzanine card which provides the input/output functions for a host card, relative to the slot or opening in the computer frame.

It is an additional object of the invention to stabilize the input/output connectors of the mezzanine card in such a way that the forces to connect and/or disconnect do not disturb the mezzanine card.

SUMMARY OF THE INVENTION

The shortcomings of the prior art are overcome and the objects of the invention are accomplished by the bracket described herein.

The bracket is desirably formed of a thin sheet of metal, preferably steel, for electrical conductivity and rigidity.

The sheet metal is stamped or punched to form holes and features as well as to form or shape the bracket. When formed by bending, the bracket is provided with mounting surfaces and bolt holes for attachment to the mezzanine card and a plurality of grounding contact surfaces, cantilevered spring fingers that have contact surfaces on the distal ends thereof, which contact a mating channel in a computer or work station frame.

The bracket is formed into a channel shape with support arms extending therefrom to attach to and support the mezzanine card.

The bracket is provided with an aperture or opening for the purpose of granting access to the interface bezel which in turn is mounted on or attached to the mezzanine card. The mezzanine card bezel defined by the IEEE standard includes a standardized bezel exterior fully compatible with the aperture and the bracket.

The bracket preferably is formed into a channel which is tapered so that upon insertion into a mating channel on the computer frame, the bracket will progressively, positively and forcibly engage the grounding contacts on the channel walls of the bracket with the mating channel walls, insuring adequate grounding connections to suppress the passage of electromagnetic interference between the frame and the bracket.

A more detailed understanding of the invention may be had by referring to the attached drawings and the detailed description that follows.

DRAWINGS

FIG. 3 illustrates a mounting channel and the printed circuit card assembly and bracket and their assembly.

DETAILED DESCRIPTION OF THE PREFERRED EMBODIMENT OF THE BEST MODE AS CONTEMPLATED BY THE INVENTORS FOR CARRYING OUT THE INVENTION

Figure 1:
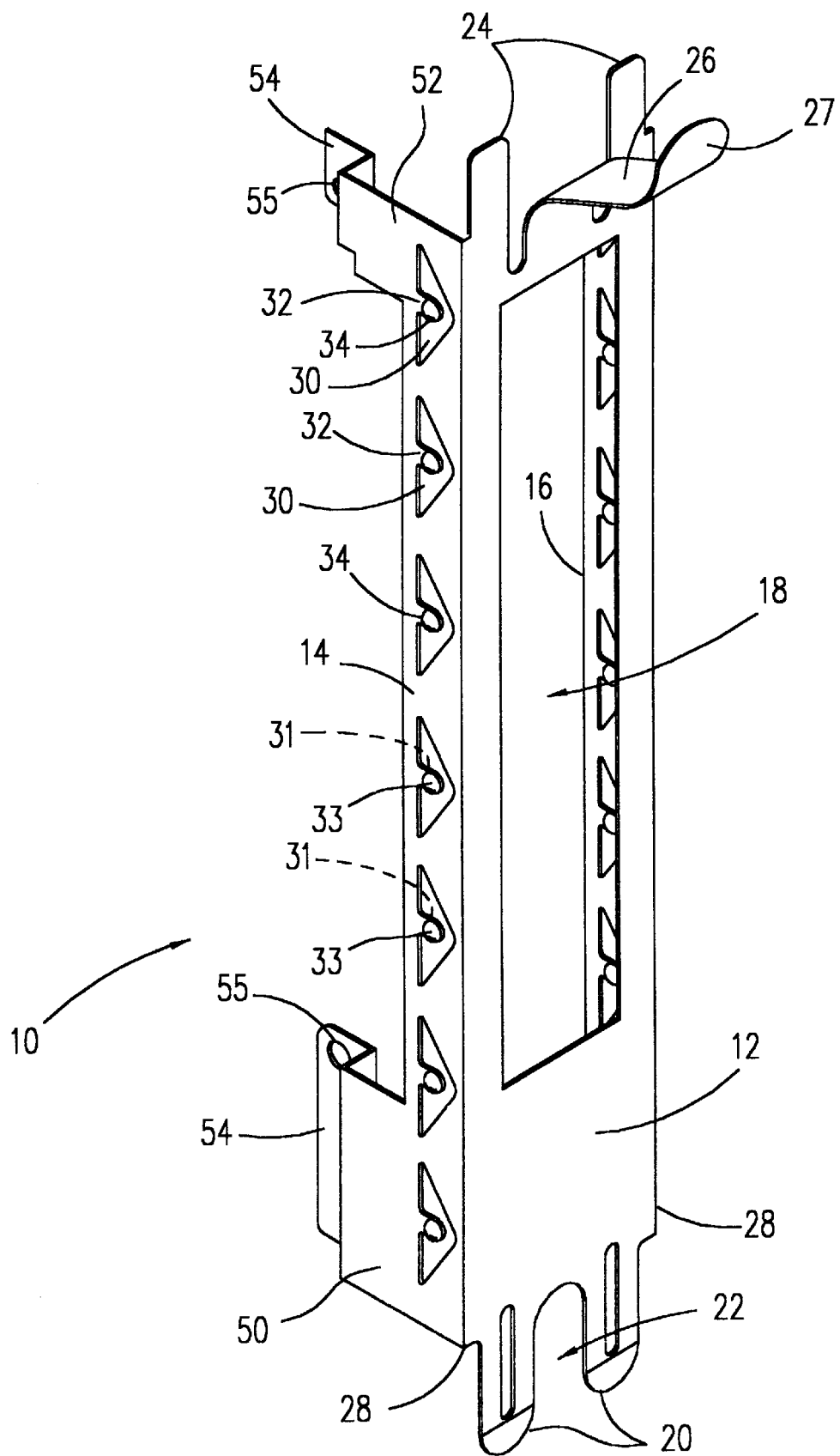
FIG. 1 illustrates the bracket of the invention.

Referring initially to FIG. 1, bracket 10 is formed having a central portion 12 and a pair of wall portions 14 and 16. The central portion 12 of the bracket 10 is further provided with an aperture 18. Aperture 18 is formed with dimensions which will permit access to an interface bezel 68 to be described later.

One end of the central portion 12 terminates in a pair of projecting legs 20 which are used for mounting the bracket 10 relative to the frame of a personal computer or computer work station (not shown). The projecting legs 20 form an opening or gap 22 which will permit the insertion of a screw or similar fastener into the frame or mounting structure of the computer and clamp the projecting legs 20 against the frame or mounting structure, thereby providing an electrical connection for grounding the bracket 10 and for aiding suppression of electromagnetic interference (EMI). The opposite end of bracket 10 is provided with two projecting legs 24 and a spring contact finger 26. The projecting legs 24 serve to act as locating surfaces for the bracket 10 and resistance elements to resist movement normal to the frame of the computer/work station while the spring finger 26 serves as a positively engaged spring-biased grounding contact, which is deformed upon installation to create a bias force, between the distal end 27 of the spring member 26 and the computer frame.

Walls 14 and 16, formed by bending the sheet metal along folds 28, form the channel shape of the bracket 10. Prior to the bending and forming of the sheet metal to become the channel shape of bracket 10, holes may be pierced or punched into the sheet metal. Apertures 30 are examples of such holes. The configuration of the holes or apertures 30 may be such that upon completion of the punching operation, a spring finger 32 remains.

Formed during the piercing of the holes, spring finger 32 may be further deformed to create a contact pad or contact surface 34 on the distal end of the finger 32 by creating a dimple on the interior surface 31 of the spring finger 32, thereby projecting the spring finger material and the surface 33 thereof. The finger 32 may be further deformed slightly out of the plane of the walls 14 or 16 so that the surface of the contact pad 34 and the finger 32 will protrude from the bracket 10.

The contact pads 34 may be engaged with a mating channel 82 shown in FIG. 3 that is part of the personal computer or work station frame (not shown). The engagement of the contact pads 34 with the mating channel 82 grounds the region of bracket 10 immediately surrounding the apertures 30 and the fingers 32 and provides an effective barrier to the emission of EMR or EMI. The precise shape of the aperture is of no particular significance so long as the aperture forms the finger 32 in the form of a cantilevered beam spring.

In order to mount the mezzanine circuit card 60, arms 50 and 52 are provided as extensions of wall 14. Arms 50, 52 are further deformed or bent, preferably at right angles, to present a mounting tab 54 which is disposed substantially parallel to wall 14 and aligned with and disposed in a position that when the mezzanine circuit card 60 is engaged with and attached to the mounting tabs 54. The interface portion of the circuit card 60 and particularly interface bezel 68 will be aligned with aperture 18, thereby granting access to the interface bezel 68 for connection. The mezzanine card 60 typically is attached to the tabs 54 using holes 55 and conventional fasteners such as machine screws and nuts (not shown). The fasteners (not shown) can ground the card 60 to the mounting tabs 54 and thus to the frame of the computer/work station (not shown).

Figure 2:
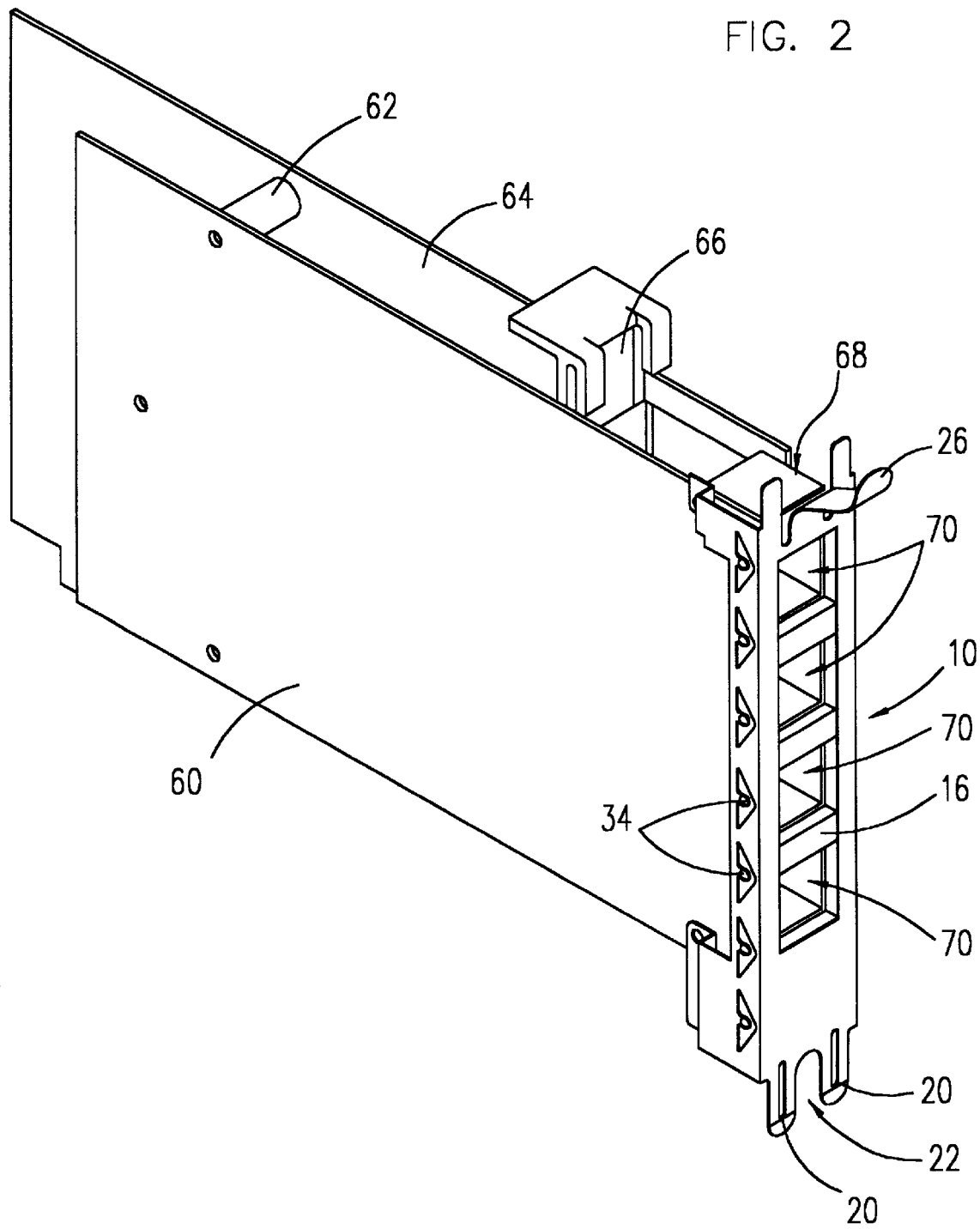
FIG. 2 illustrates the mezzanine card mounting bracket attached to and supporting one end of a mezzanine card which in turn is attached to a host circuit card.

Referring now to FIG. 2, as described earlier, bracket 10 is illustrated as disposed on or attached to mezzanine card 60. Mezzanine card 60 is further supported through screws, bolts, or similar fasteners (not shown) and stand-off 62 on the host card 64. The two cards, guest or mezzanine 60 and host 64, are electrically interconnected through a connector 66.

In order to interface the mezzanine card 60 with connectors on cables coming from other devices, a mezzanine card bezel 68 or Input/Output (I/O) bezel 68 is attached to one planar surface of the mezzanine card 60 and electrically connected to conductive contacts (not shown) of the mezzanine card 60 which serve as output channels for the I/O function. The bezel 68 illustrated shows four cavities 70 which will accommodate plugs on cables. The cavities 70 in the bezel 68 are exemplary of the type of socket into which standard telephone connectors may be inserted if this device were intended to be used as a I/O bezel for a facsimile or modem card. Similarly, the mezzanine card bezel 68 may be fabricated with either male of female connectors, as needed, with the only restriction being that the entire interface must occupy an area smaller than that of the aperture 18 so that access from outside the computer/work station may be accomplished to the mezzanine card bezel 68.

With the mezzanine card 60, the host card 64, the mezzanine card bezel 68, and the bracket 10 all combined, the assembly then may be inserted into a personal computer or work station and the contact surface 34 engaged with a surface 84 in a channel 82 which is part of the frame of the personal computer or work station. Installation of this assembly into the personal computer or work station will engage the distal end 27 of spring finger 26 with the frame of the personal computer or work station and cause deflection of spring finger 26, thereby generating a spring force to maintain the distal end 27 of the spring finger 26 engaged against a surface of the computer frame. Thus, reliable grounding is established for the end of the bracket 10. The opposite end of bracket 10 may be attached to the computer frame by inserting through gap 22 a screw 86 and tightening it to engage and force legs 20 into engagement with the computer frame.

The tapered form of bracket 10 and the channel 82 of channel mount 80 insures minimum force is required for insertion while guaranteeing that the contact surfaces 34 are forcibly engaged with the channel wall surface 84 for electrical grounding contact. Most of the movement of the bracket 10, during insertion of the bracket 10 into channel 82, is without resistance due to the taper of both the bracket 10 and the channel 82. Once contact surfaces 34 engage the inner surface 84 of channel 82, only a short additional translation of the bracket 10 toward its narrow end will finally and completely seat bracket 10 into channel 82. The taper reduces the forces required to reliably install the printed circuit boards 60, 64 and the Mezzanine card bracket 10 into the computer/work station. After insertion of bracket 10 into channel 82, screw 86 may be inserted between legs 20 and into hole 88 to fix bracket 10 into place.

The curved arrow in FIG. 3 shows the direction of insertion of the bracket 10 into the channel 82 of the mounting channel of FIG. 3. The bend in the arrow indicates the turning of the bracket 10 and associated circuit boards 60, 64 to align with the channel 82.

One of skill in the art will recognize that modifications and changes of a minor nature may be made to the device disclosed while at the same time not removing the device from the scope of the attached claims.

Some of the modifications could involve the shapes of the holes formed in the side walls of the bracket which define the spring fingers 32, as well as those regarding the precise location, shape, and form of the arms 52, 54 and the direction of the taper of the bracket 10.

What is claimed is:

1. An electronic circuit board mounting bracket for attaching a circuit board to a computer frame and providing an interface opening comprising:

an electrically conductive material formed into a channel of predetermined width and depth, having a central portion and a pair of wall portions defining said width and depth;

a pair of appendages extending from one of said wall portions and away from said central portion;

said appendages formed to dispose mounting surfaces of said appendages in a plane intersecting said central portion, and a plurality of grounding contacts disposed along said wall portions so that the grounding contacts on one of the side wall portions extends away from the grounding contacts on the other side wall portion, whereby said bracket may be attached to said circuit board and engaged with said computer frame, thus providing electromagnetic shielding and electrical grounding surrounding said interface opening.

2. The electronic circuit board mounting bracket of claim 1 wherein said mounting surfaces are disposed in said plane which is normal to said central portion.

3. The electronic circuit board mounting bracket of claim 1 wherein said central portion defines an aperture providing access to said circuit board therethrough.

4. The electronic circuit board mounting bracket of claim 1 wherein said mounting surfaces are interrupted thereby providing mounting apertures for attaching said circuit board.

5. The electronic circuit board mounting bracket of claim 1 wherein said central portion terminates at one end thereof in a pair of extensions spaced apart from each other and forming a gap whereby, said bracket may be attached to a frame member of an electronic device by a screw extending through said gap.

6. The electronic circuit board mounting bracket of claim 1 wherein said grounding contacts comprise cantilevered members and a projecting surface extending from a surface of said cantilevered members.

7. The electronic circuit board mounting bracket of claim 5 wherein said bracket further comprises an electrical grounding contact disposed on an end of said bracket displaced from said end having said extensions and said gap.

8. The electronic circuit board mounting bracket of claim 7 wherein said grounding contact comprises a projecting beam with a deformation thereof displacing said beam out of a plane defined by said central portion of said bracket, for forcible surface engagement with said frame of said computer.

9. An electronic circuit card mounting system comprising:

a first channel-shaped member having a first pair of wall portions;

said first pair of wall portions comprising a pair of planar surfaces disposed converging relative each other;

a mounting bracket formed of a central portion disposed intermediate a second pair of wall portions, said second pair of wall portions disposed to converge to the same extent as said first pair of wall portions;

one of said second pair of wall portions further comprising support arms extending therefrom and having one mounting surface on each of said support arms to accept and support an electrical circuit card;

said second pair of wall portions defining openings therein wherein said openings define contact members, said contact members engageable with said first pair of wall members;

whereby said bracket is grounded to said first channel-shaped member and provides positioning and support to said electrical circuit card.

10. The electronic circuit card mounting system of claim 9 wherein said central portion of said bracket defines an access aperture aligned with said electrical circuit card.

11. The electronic circuit card mounting system of claim 10 wherein said circuit card comprises an interface bezel and said bezel and said access aperture are aligned to provide access to said bezel through said aperture.

12. The electronic circuit card mounting system of claim 11 wherein said bracket further includes a slot alignable with a hole in said channel-shaped member, and a fastener engaged with said bracket and said hole to establish a grounding contact therebetween.

13. An electronic circuit card mounting system comprising a channel having a pair of sidewalls, said sidewalls converging toward each other;

a channel shaped bracket attached to an electrical circuit card, said channel formed of a central portion interconnecting a pair of wall members, said wall members disposed to converge toward each other to the same extent said sidewalls converge, said wall members defining a plurality of resilient grounding contacts engageable with said sidewalls;

whereby said bracket may be inserted into said channel and then displaced within said channel in a direction to progressively engage said grounding contacts with, said sidewalls.

* * * * *